(12) United States Patent
Hong (10) Patent No.: US 9,583,368 B2
(45) Date of Patent: Feb. 28, 2017

(54) FLIP CHIP PACKAGE AND MANUFACTURING METHOD THEREOF

(71) Applicant: SAMSUNG ELECTRO-MECHANICS CO., LTD., Suwon-si (KR)

(72) Inventor: Seok Yoon Hong, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 15/147,254

(22) Filed: May 5, 2016

(65) Prior Publication Data
US 2016/0260622 A1  Sep. 8, 2016

Related U.S. Application Data

(62) Division of application No. 14/678,674, filed on Apr. 3, 2015, now abandoned.

(30) Foreign Application Priority Data

Aug. 20, 2014  (KR) .......................... 10-2014-0108376

(51) Int. Cl.
| | |
|---|---|
| *H01L 21/20* | (2006.01) |
| *H01L 21/56* | (2006.01) |
| *H01L 23/00* | (2006.01) |
| *H01L 23/31* | (2006.01) |
| *H01L 21/48* | (2006.01) |

(Continued)

(52) U.S. Cl.
CPC ........ *H01L 21/563* (2013.01); *H01L 21/4846* (2013.01); *H01L 21/4853* (2013.01); *H01L 23/3142* (2013.01); *H01L 23/3185* (2013.01); *H01L 23/49811* (2013.01); *H01L 23/49838* (2013.01); *H01L 24/17* (2013.01); *H01L 24/81* (2013.01); *H01L 23/49827* (2013.01); *H01L 23/50* (2013.01); *H01L 2021/60022* (2013.01); *H01L 2224/11013* (2013.01); *H01L 2224/16225* (2013.01); *H01L 2224/16227* (2013.01); *H01L 2224/16237* (2013.01); *H01L 2224/32225* (2013.01); *H01L 2224/73204* (2013.01);

(Continued)

(58) Field of Classification Search
None
See application file for complete search history.

(56) References Cited

U.S. PATENT DOCUMENTS

| | | | |
|---|---|---|---|
| 5,920,126 A | 7/1999 | Sohara | |
| 6,324,069 B1 | 11/2001 | Weber | |

(Continued)

*Primary Examiner* — Michael Lebentritt
(74) *Attorney, Agent, or Firm* — NSIP Law (57) ABSTRACT

A flip chip package and a manufacturing method thereof are disclosed. The flip chip package in accordance with an embodiment of the present invention includes: a substrate; a plurality of pads formed on the substrate; a solder resist covering the substrate in such a way that the pads are exposed; a chip mounted on the substrate in such a way that the chip is electrically connected with the pads; a plurality of bumps formed, respectively, on the pads in such a way that the bumps are interposed between the pads and the chip; an under-fill flowing between the substrate and the chip and being filled in between the substrate and the chip; and an opening placed in between the plurality of bumps in such a way that a flowing space of the under-fill is provided in between the plurality of bumps.

9 Claims, 8 Drawing Sheets

(51) Int. Cl.
*H01L 23/498* (2006.01)
*H01L 23/50* (2006.01)
*H01L 21/60* (2006.01)

(52) U.S. Cl.
CPC ............... *H01L 2224/81191* (2013.01); *H01L 2224/92125* (2013.01)

(56) References Cited

U.S. PATENT DOCUMENTS

| | | |
|---|---|---|
| 7,768,136 B2 | 8/2010 | Fukuta et al. |
| 2003/0045030 A1 | 3/2003 | Hayashida et al. |
| 2004/0105223 A1 | 6/2004 | Okada et al. |
| 2004/0188819 A1 | 9/2004 | Farnworth et al. |
| 2007/0045867 A1 | 3/2007 | Machida |
| 2007/0111379 A1 | 5/2007 | Shim et al. |
| 2008/0038670 A1* | 2/2008 | Card ........................ H05K 3/28 430/311 |
| 2008/0122053 A1 | 5/2008 | Ofner et al. |
| 2008/0179738 A1 | 7/2008 | Nishimura et al. |
| 2008/0248611 A1 | 10/2008 | Hanada et al. |
| 2009/0294162 A1 | 12/2009 | Jeong et al. |
| 2010/0148332 A1 | 6/2010 | Kajiki |
| 2013/0063917 A1 | 3/2013 | Choi et al. |

\* cited by examiner

FLIP CHIP PACKAGE AND MANUFACTURING METHOD THEREOF

CROSS-REFERENCE TO RELATED APPLICATIONS

This application is a divisional application of U.S. patent application Ser. No. 14/678,674, filed on Apr. 3, 2015, which claims the benefit of Korean Patent Application No. 10-2014-0108376, filed with the Korean Intellectual Property Office on Aug. 20, 2014, the disclosure of which is incorporated herein by reference in its entirety.

BACKGROUND

1. Technical Field

The present invention relates to a flip chip package and a method of manufacturing the same.

2. Background Art

With the sharp increase in the demand for mobile electronic products, the components installed in the electronic products need to be increasingly smaller and lighter. Used for smaller and lighter components in semiconductor packages has been a flip chip process.

In the flip chip process, a filler is interposed between a semiconductor chip and a substrate. The filler mitigates the difference in the coefficient of thermal expansion between the semiconductor chip and the substrate and protects solder bumps, enhancing the reliability of the semiconductor package.

When filling with the filler, the lower the height of the semiconductor chip on the substrate and the narrower the gap between the solder bumps, the filler is flowed in more unevenly, thereby possibly causing a void in which air is trapped in the filler.

The related art of the present invention is disclosed in Korea Patent Publication No. 10-2013-0058401 (A SEMICONDUCTOR PACKAGE; laid open on Jun. 4, 2013).

SUMMARY

The present invention provides a flip chip package and a manufacturing method thereof that may prevent an under-fill void.

An aspect of the present invention provides a flip chip package that may allow an under-fill to flow faster in between a plurality of bumps by removing a solder resist in between the plurality of bumps.

The flip chip package may include a substrate, a plurality of pads, a solder resist, a chip mounted on the substrate, bumps, and an under-fill being filled in between the substrate and the chip, and the solder resist may include an opening in such a way that a flowing space of the under-fill is provided in between the plurality of bumps.

An inner material layer may be formed inside the opening, and a wettability of the under-fill for the inner material layer may be greater than a wettability of the under-fill for the solder resist. The inner material layer may be made of a metal and may be formed to be separated from the pads. The inner material layer may formed to be separated from a connecting part for connecting at least two of the pads with one another. The inner material layer may be covered by the solder resist and then exposed by the opening.

The opening may be extended in a flowing direction of the under-fill and may be formed in a disconnected fashion. One end of the opening may be extended to an area of the substrate where the under-fill is dispensed, the other end of the opening may be extended to an outside area of the chip.

Another aspect of the present invention provides a method of manufacturing flip chip package that may increase flow speed of an under-fill in between a plurality of bumps by removing a solder resist in between the plurality of bumps.

The method of manufacturing a flip chip may include: forming pads on a substrate; forming a solder resist; removing portions of the solder resist so as to expose the pads; forming an opening; mounting a chip; and filling with an under-fill.

The forming of the pads may include forming an inner material layer on the substrate in such a way that the inner material layer is arranged in between the plurality of pads, and the solder resist may cover the pads and the inner material layer, and the inner material layer may be exposed by the opening, and a wettability of the under-fill for the inner material layer may be greater than a wettability of the under-fill for the solder resist.

DETAILED DESCRIPTION

Hereinafter, certain embodiments of a flip chip package and a manufacturing method thereof in accordance with the present invention will be described in detail with reference to the accompanying drawings. In describing the present invention with reference to the accompanying drawings, any identical or corresponding elements will be assigned with same reference numerals, and no redundant description thereof will be provided.

Terms such as "first" and "second" can be used in merely distinguishing one element from other identical or corresponding elements, but the above elements shall not be restricted to the above terms.

When one element is described to be "coupled" to another element, it does not refer to a physical, direct contact between these elements only, but it shall also include the possibility of yet another element being interposed between these elements and each of these elements being in contact with said yet another element.

Figure 1:
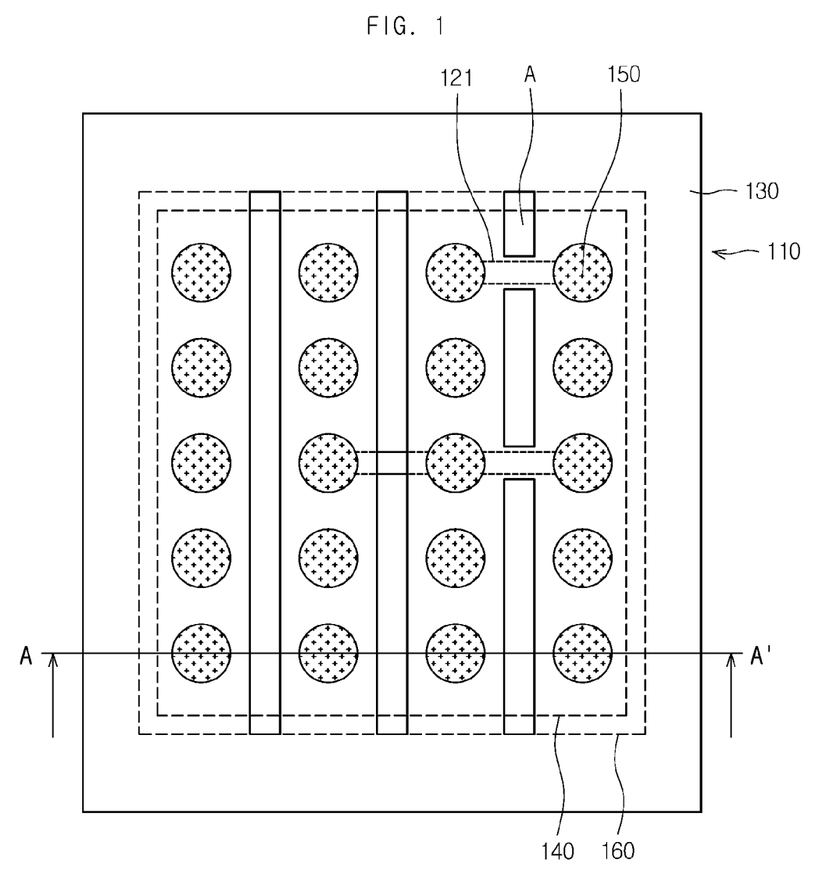
FIG. 1 is a plan view showing a flip chip package in accordance with an embodiment of the present invention.
Figure 2:
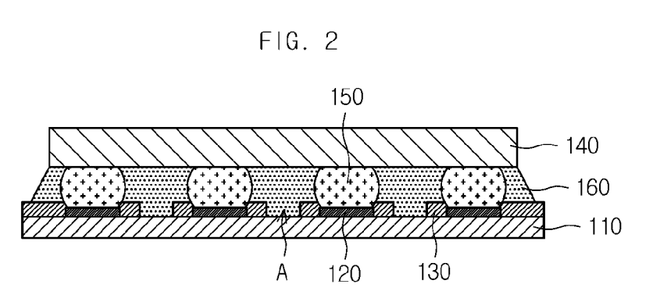
FIG. 2 is a cross-sectional view of the flip chip package shown along the A-A' section in accordance with an embodiment of the present invention.
Figure 3:
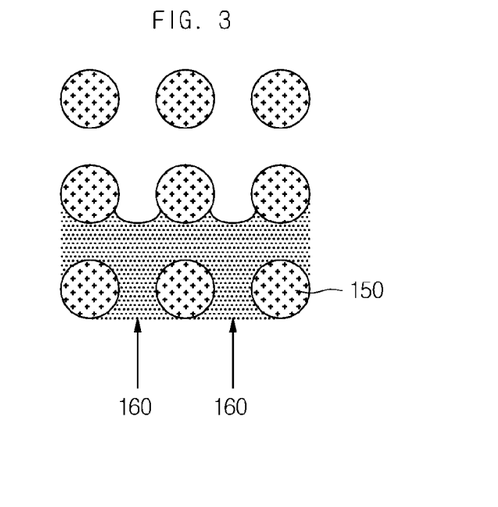
FIG. 3 shows a common under-fill flowed among bumps.

FIG. 1 is a plan view showing a flip chip package in accordance with an embodiment of the present invention. FIG. 2 is a cross-sectional view of the flip chip package shown along the A-A' section in accordance with an embodiment of the present invention. FIG. 3 shows a common under-fill flowed among bumps.

Referring to FIG. 1 and FIG. 2, the flip chip package in accordance with an embodiment of the present invention may include a substrate 110, a pad 120, a solder resist 130, a chip 140, a bump 150 and an under-fill 160, and the solder resist 130 may include an opening A.

The substrate 110 is a circuit board having a circuit formed on an upper surface thereof and may be formed in multiple layers.

The pad 120 is formed on the substrate 110 in such a way that the pad 120 is electrically connected with the circuit for a contact with the chip 140. The pad 120 may be provided in plurality, and the plurality of pads 120 may be arranged in both longitudinal and lateral directions.

At least two of the pads 120 may be connected by a connecting part 121. Among the plurality of pads 120, at least two of the pads 120 having an identical function may be electrically connected with each other by the connecting part 121, which is interposed between the two pads 120.

The solder resist 130 is a resist that protects the circuit. Although the solder resist 130 protects the circuit, the solder resist 130 is formed on the substrate 110 in such a way that the pads 120 are exposed. In other words, the solder resist 130 covers an entire upper surface of the substrate 110 except for the pads 120.

The chip 140, which is mounted on the substrate 110, may include a semiconductor chip. The chip 140 has a chip pad formed there on for connection with a circuit of the chip 140, and the chip pad is in contact with the pads 120 of the substrate 110 for electrical connection between the chip 140 and the substrate 110.

The bump 150 is a connector that connects the pad 120 of the substrate 110 with the chip pad and is interposed between the pad 120 of the substrate 110 and the chip 140. The bump 150 may be provided in plurality, the plurality of bumps 150 may be formed on the plurality of pads 120, respectively. The bump 150 may be a solder.

The under-fill 160 is a filler that is filled between the substrate 110 and the chip 140. The under-fill 160, which may be epoxy, flows in between the substrate 110 and the chip 140 to be filled between the substrate 110 and the chip 140.

The under-fill 160 is dispensed to one side of the substrate 110 and flows to the other side of the substrate 110. An area at which the under-fill 160 is dispensed may be an outside of the chip 140. The dispensed under-fill 160 passes through in between the plurality of bumps 150 to move from the one side of the substrate 110 to the other side of the substrate 110.

Generally, the under-fill 160 passing through in between the plurality of bumps 150 has concave shapes, as shown in FIG. 3, and accordingly, the under-fill 160 slows down while passing through the plurality of bumps 150. Particularly, the portion of the under-fill 160 passing through the middle between two bumps 150 becomes significantly slower, and this uneven flow speed of the under-fill 160 may cause a void.

Referring to FIG. 1 and FIG. 2 again, the opening A of the present invention is an area where a portion of the solder resist 130 placed among the plurality of bumps 150 is removed. The flowing space for the under-fill 160 in between the plurality of bumps 150 may be expanded by the opening A.

The time (t) required for having the under-fill 160 filled may be obtained by the following equation.

$$t = \frac{3\mu L^2}{h\gamma\cos\theta}.$$

Here, L is a length of the chip 140 in a moving direction of the under-fill 160, h is a height of the flowing space of the under-fill 160, θ a wetting angle, μ a viscosity of the under-fill 160, and ν a surface tension of the under-fill 160.

As described above, the height of the flowing space of the under-fill 160 flowing in between the plurality of bumps 150 is increased by the opening A in the present invention, and thus the h value becomes greater and the t value becomes smaller in the above equation.

The faster the under-fill 160 is filled, that is, the faster the under-fill 170 flows, the chances of having the void occurred become smaller. Therefore, in the present invention, the speed of the under-fill 160 flowing in between the plurality of bumps 150 is increased by the opening A, and the overall flow speed of the under-fill 160 becomes uniform, thereby reducing the occurrence of the void.

The width of the opening A may be smaller than an inside distance between the plurality of pads 120. If the opening A were excessively wide, the circuit might be exposed.

As shown in FIG. 2, the opening A may be extended in the flowing direction of the under-fill 160. Moreover, the opening A may be continuously formed in the flowing direction of the under-fill 160.

While the opening A is formed to be extended in the flowing direction of the under-fill 160, the under-fill 160 may not be continuous. In such a case, the opening A may be formed by avoiding the connecting part 121. Moreover, if necessary, the connecting part 121 may be exposed by the opening A.

One end of the opening A may be extended to the area where the under-fill 160 is dispensed. In such a case, the distance between the one end of the opening A to a side of the chip 140 may be 100 um or greater.

Moreover, the other end of the opening A may be extended to an outside area of the chip 140. In such a case, the under-fill 160 may be uniformly filled in a greater area than that of the chip 140. Moreover, in such a case, the distance from the other end of the opening A to the side of the chip 140 may be greater than or equal to a vertical distance between the solder resist 130 and the substrate 110.

Figure 4:
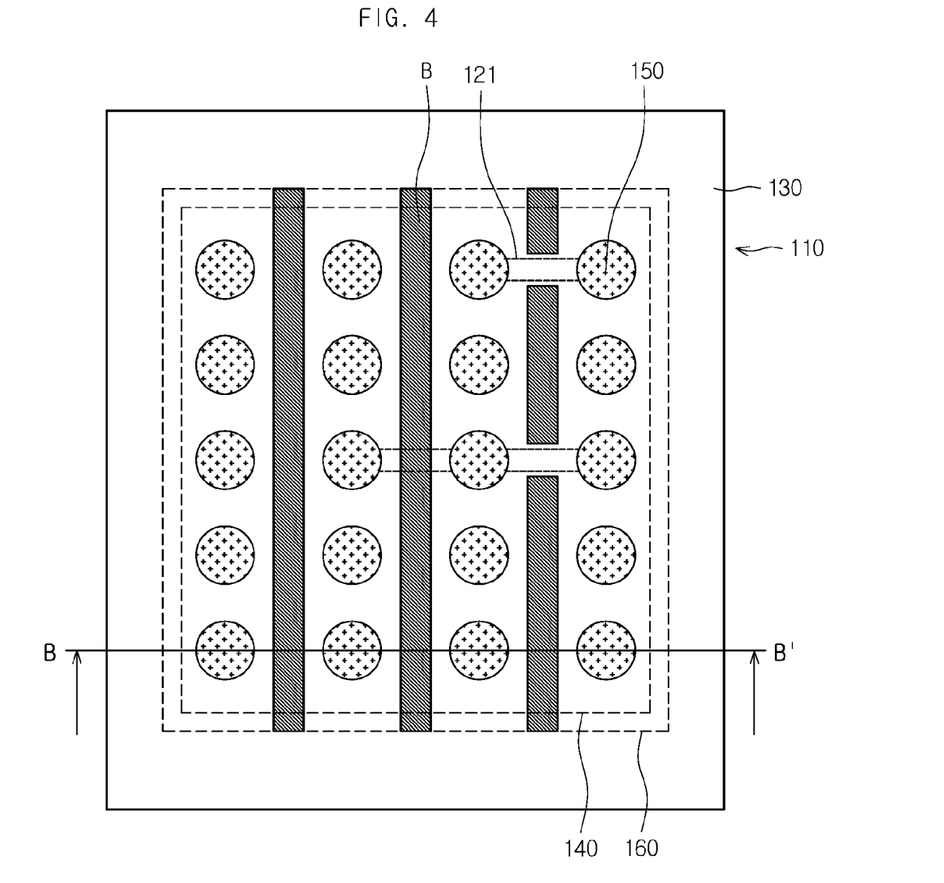
FIG. 4 is a plan view showing a flip chip package in accordance with another embodiment of the present invention.
Figure 5:
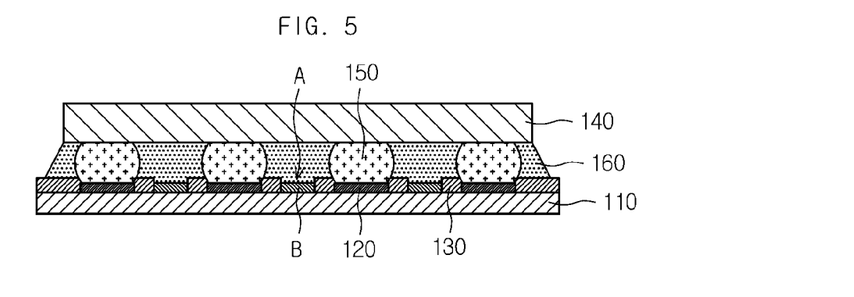
FIG. 5 is a cross-sectional view of the flip chip package shown along the B-B' section in accordance with another embodiment of the present invention.

FIG. 4 is a plan view showing a flip chip package in accordance with another embodiment of the present invention, and FIG. 5 is a cross-sectional view of the flip chip package shown along the B-B' section in accordance with another embodiment of the present invention.

Referring to FIG. 4 and FIG. 5, the flip chip package in accordance with another embodiment of the present invention may include a substrate 110, a pad 120, a solder resist 130, a chip 140, a bump 150 and an under-fill 160, and may further include an inner material layer B. Here, the substrate 110, the pad 120, the solder resist 130, the chip 140, the bump 150 and the under-fill 160 have been already described above and thus will not be redundantly described herein.

The inner material layer B is formed inside an opening A formed by having a portion of the solder resist 130 removed and may be thinner than the solder resist 130.

A wettability of the under-fill 160 for the inner material layer B is greater than those of the under-fill 160 for the solder resist 130 and for the substrate 110.

Here, the "wettability" refers to how well the under-fill 160 is spread. In other words, the under-fill 160 flows better on the inner material layer B than on the solder resist 130 or the substrate 110. Specifically, the wetting angle θ becomes smaller in the above equation, making the t value smaller.

Therefore, by forming the inner material layer B inside the opening A, the space for allowing the under-fill 160 to flow in between the bumps 150 is provided, and the wettability of the under-fill 160 is increased owing to the inner material layer B, speeding up the flow speed of the under-fill 160 and thus reducing the occurrence of the void.

The inner material layer B may be made of a metal, for example, copper, which is the same metal as the pad 120. The under-fill 160 may flow fast on a metallic surface.

The opening A and the inner material layer B may be extended in the flowing direction of the under-fill 160 and may be formed to be continuous or not continuous.

The inner material layer B may be formed to be separated from the pad 120. Particularly, in the case where the inner material layer B is metallic, the inner material layer B may be formed to be separated from the pad 120 in order to prevent the inner material layer B from making an unnecessary contact with the pad 120. In such a case, the inner material layer B may be narrower than an inside distance between a plurality of pads 120.

The inner material layer B may be formed by avoiding a connecting part 121. That is, the inner material layer B may be formed to be separated from the connecting part 121 of the pad 120. In such a case, the inner material layer B may not be continuously formed.

Meanwhile, the inner material layer B may be formed to be in contact with the connecting part 121 of the pad 120. As long as the inner material layer B is disconnected from a circuit even if the inner material layer B is electrically connected with the connecting part 121, the inner material layer B may be allowed to be in contact with the connecting part 121 of the pad 120.

In the case where the inner material layer B is formed to correspond to a length of the opening A, one end of the inner material layer B may be extended to an area where the under-fill 160 is dispensed. In such a case, the distance between the one end of the inner material layer B to a side of the chip 140 may be 100 um or greater. Moreover, the other end of the inner material layer B may be extended to an outside area of the chip 140.

The inner material layer B may be covered, together with the pad 120, by the solder resist 130 and then exposed by forming the opening A by removing a portion of the solder resist 130. In such a case, since the inner material layer B is exposed with the pad 120 through a same process, no additional process is needed to expose the inner material layer B, making it possible to simplify the manufacturing process.

Figure 6:
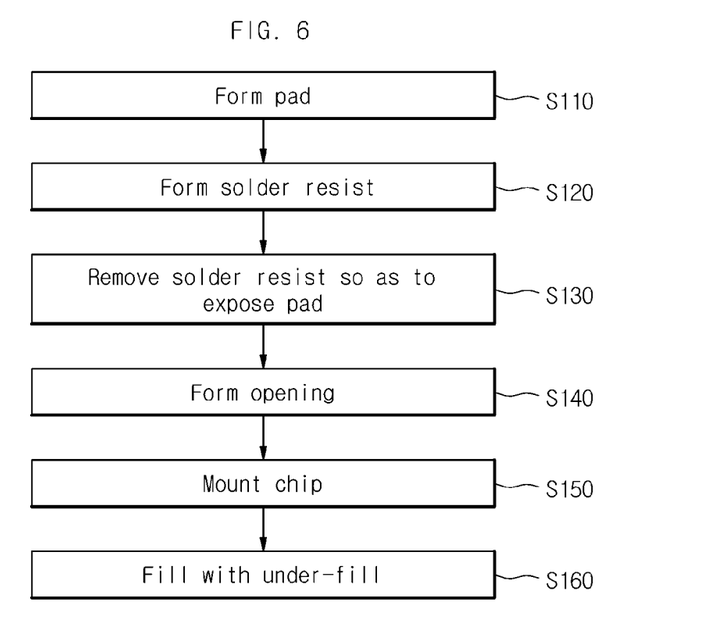
FIG. 6 is a flow diagram showing a method of manufacturing a flip chip package in accordance with an embodiment of the present invention.

FIG. 6 is a flow diagram showing a method of manufacturing a flip chip package in accordance with an embodiment of the present invention. FIG. 7, FIG. 8, FIG. 9, FIG. 10, FIG. 11 and FIG. 12 show respective processes of the method of manufacturing a flip chip package in accordance with an embodiment of the present invention.

Referring to FIG. 6, the method of manufacturing a flip chip package in accordance with an embodiment of the present invention may include forming a pad (S110), forming a solder resist (S120), removing the solder resist so as to expose the pad (S130), forming an opening (S140), mounting a chip (S150) and filling with an under-fill (S160).

Figure 7:
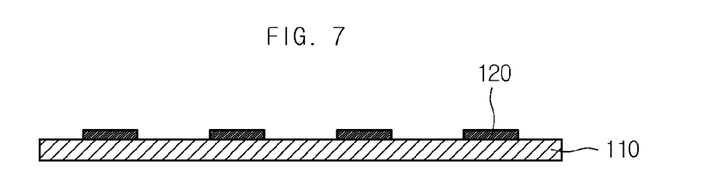
FIG. 7, FIG. 8, FIG. 9, FIG. 10, FIG. 11 and FIG. 12 show respective processes of the method of manufacturing a flip chip package in accordance with an embodiment of the present invention.

Referring to FIG. 7, in the step of forming a pad 120 (S110), the pad configured for electrical connection with a circuit is formed on a substrate 110. The pad 120 may be formed at the same time as the circuit. The pad 120 is provided in plurality, and is formed at a location corresponding to where a chip 140 is mounted.

The step of forming the pad 120 (S110) may include forming a connecting part 121 for connecting at least two pads 120 with one another. The connecting part 121 is interposed between a pad 120 and another pad 120 to electrically connect a plurality of pads 120 with one another.

Figure 8:
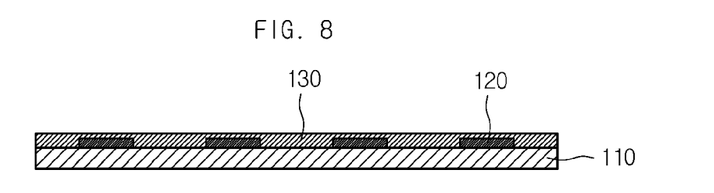

Referring to FIG. 8, in the step of forming a solder resist 130 (S120), the solder resist 130 is formed on the substrate 110 so as to cover the circuit and the pad 120.

Figure 9:
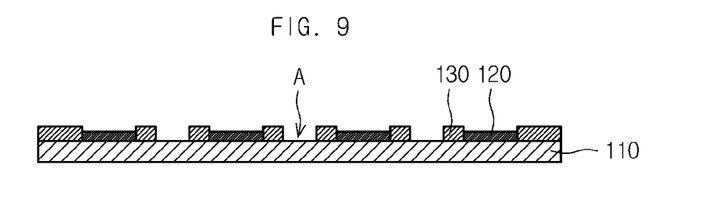

Referring to FIG. 9, in the step of removing the solder resist 130 so as to expose the pad 120 (S130), a portion of the solder resist 130 is removed in such a way that the pad 120 is exposed while the circuit is covered by the solder resist 130.

In the step of forming an opening A (S140), the opening A is formed by removing a portion of the solder resist 130 arranged in between the plurality of pads 120. The opening A may be formed in between the plurality of pads 120, and the substrate 110 may be exposed by the opening A.

Meanwhile, as shown in FIG. 9, the step of forming the opening A (S140) may be processed simultaneously with the step of removing a portion of the solder resist 130 for exposing the pad 120. For example, the portions of the solder resist 130 corresponding to the pad 120 and the opening A may be removed simultaneously through a lithography process.

The opening A may be narrower than an inside distance between the plurality of pads 120. If the opening A is excessively wide, the circuit might be exposed.

Figure 10:
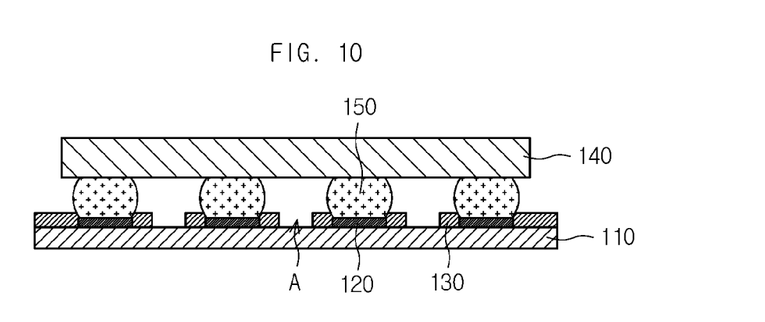

Referring to FIG. 10, in the step of mounting the chip 140 (S150), the chip 140 having a plurality of bumps 150 thereon is mounted on the substrate, and the plurality of bumps 150 make contact, respectively, with the plurality of pads 120. The substrate 110 and the chip 140 are electrically connected with each other by the pads 120 and the bumps 150.

Figure 11:
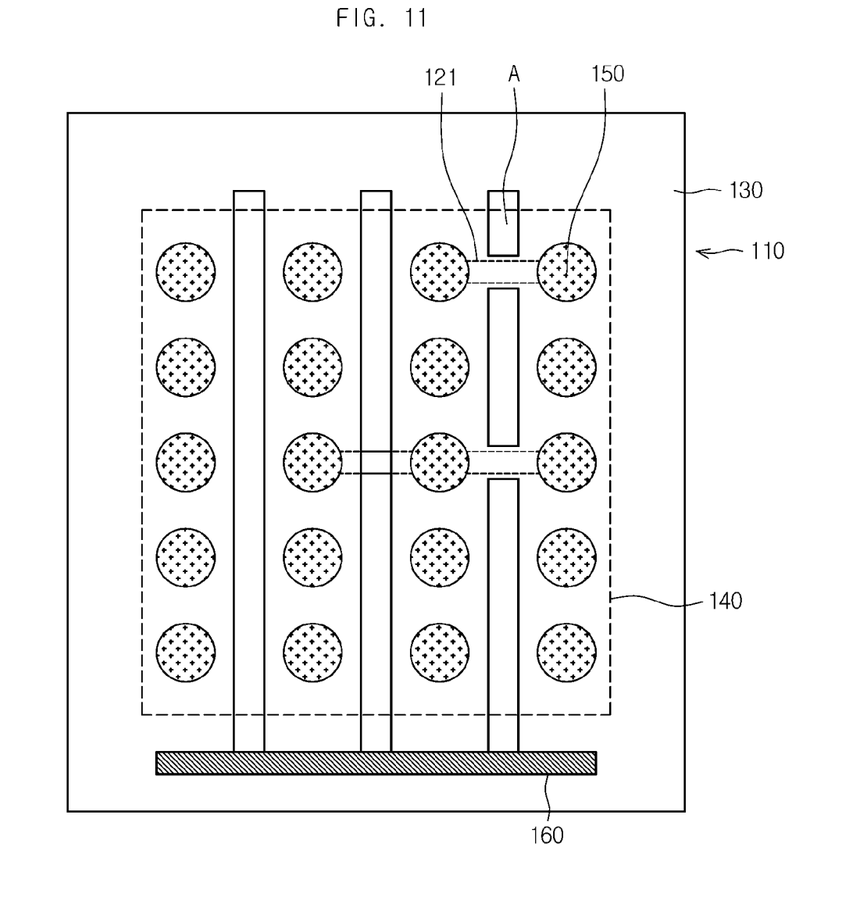
Figure 12:
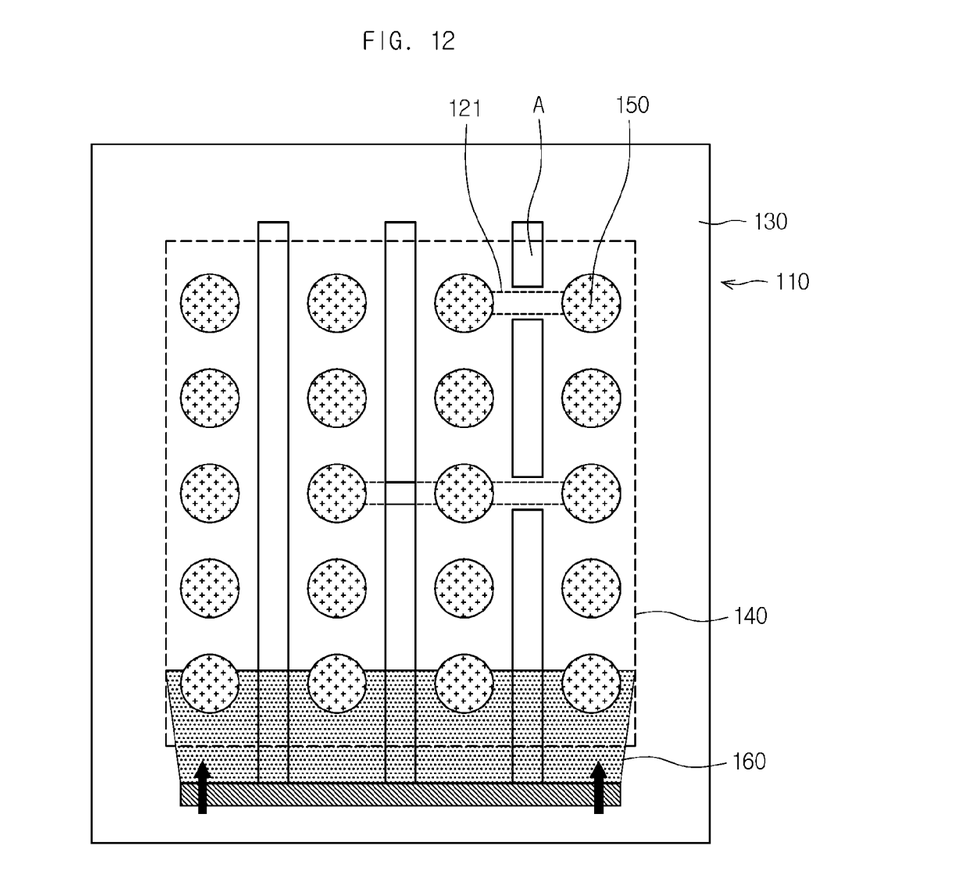

Referring to FIG. 11 and FIG. 12, in the step of filling with an under-fill 160 (S160), the under-fill 160 is flowed in between the plurality of bumps 150, and the under-fill 160 is filled between the substrate 110 and the chip 140. Here, a greater space for allowing the under-fill 160 to flow may be provided by the opening A than when there is no opening, and thus a faster flow of the under-fill 160 between the plurality of bumps 150 may be provided. Accordingly, the under-fill 160 may be flowed at a uniform speed, resulting in prevention of occurrence of a void.

The step of filling with the under-fill 160 (S160) may include dispensing the under-fill 160 to one side of the substrate 110 (see FIG. 11) and allowing the under-fill 160 to flow to the other side of the substrate 110 (see FIG. 12).

In the step of dispensing the under-fill 160 to the one side of the substrate 110, the under-fill 160 is dispensed in an outside area of the chip 140. In the step of allowing the under-fill 160 to the other side of the substrate 110, the under-fill 160 moves to the other side of the substrate 110 by a capillary phenomenon. The under-fill 160 passes in between the plurality of bumps 150 to be filled between the chip 140 and the substrate 110.

The opening A may be extended in the flowing direction of the under-fill 160. The opening A may be formed continuously in the flowing direction of the under-fill 160.

While the opening A is extended in the flowing direction of the under-fill 160, the under-fill 160 may not be continuous. In such a case, the opening A may be formed by avoiding the connecting part 121. Moreover, if necessary, the connecting part 121 may be exposed by the opening A.

One end of the opening A may be extended to the area where the under-fill 160 is dispensed. In such a case, the distance between the one end of the opening A to a side of the chip 140 may be 100 um or greater.

Moreover, the other end of the opening A may be extended to an outside area of the chip 140. In such a case, the distance from the other end of the opening A to the side of the chip 140 may be greater than or equal to a vertical distance between the solder resist 130 and the substrate 110.

Figure 13:
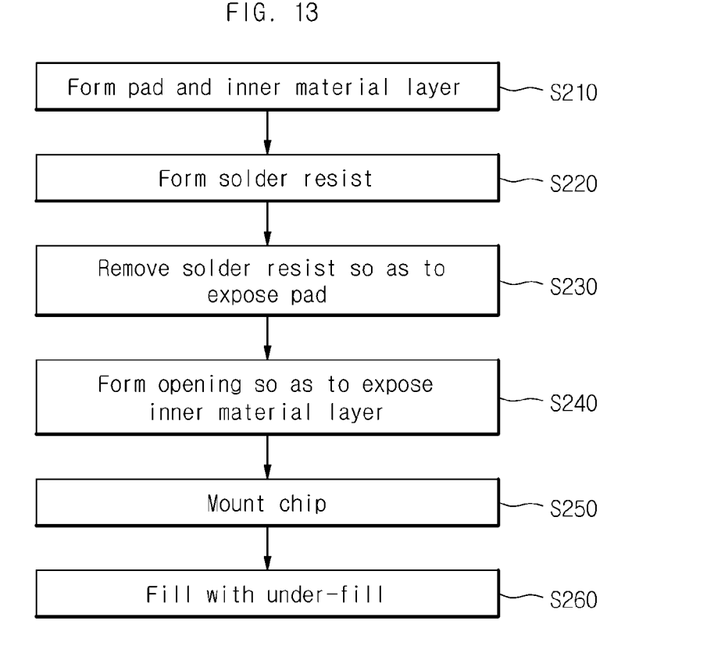
FIG. 13 is a flow diagram showing a method of manufacturing a flip chip package in accordance with another embodiment of the present invention.

FIG. 13 is a flow diagram showing a method of manufacturing a flip chip package in accordance with another embodiment of the present invention. FIG. 14, FIG. 15, FIG. 16, FIG. 17 and FIG. 18 show respective processes of the method of manufacturing a flip chip package in accordance with another embodiment of the present invention.

Referring to FIG. 13, the method of manufacturing a flip chip package in accordance with another embodiment of the present invention may include forming a pad and an inner material layer (S210), forming a solder resist (S220), removing the solder resist so as to expose the pad (S230), forming an opening so as to expose the inner material layer (S240), mounting a chip (S250) and filling with an under-fill (S260).

Figure 14:
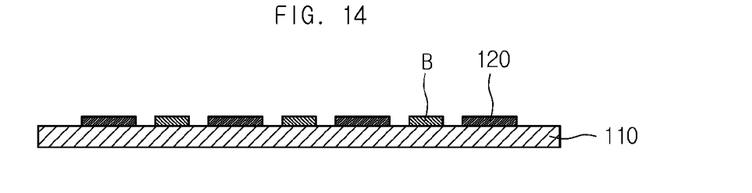
FIG. 14, FIG. 15, FIG. 16, FIG. 17 and FIG. 18 show respective processes of the method of manufacturing a flip chip package in accordance with another embodiment of the present invention.

Referring to FIG. 14, in the step of forming a pad 120 and an inner material layer B (S210), the pad 120 and the inner material layer B are formed on a substrate 110. In the present embodiment, the inner material layer B may be formed simultaneously with the pad 120, and may be arranged in between a plurality of pads 120. The pad 120 and the inner material layer B have been described above and thus will not be redundantly described herein.

A wettability of an under-fill 160 for the inner material layer B is greater than those of the under-fill 160 for a solder resist 130 and for the substrate 110.

The inner material layer B may be formed to be separated from the pad 120. Particularly, in the case where the inner material layer B is metallic, the inner material layer B may be formed to be separated from the pad 120 in order to prevent the inner material layer B from making an unnecessary contact with the pad 120. In such a case, the inner material layer B may be narrower than an inside distance between the plurality of pads 120.

The inner material layer B may be formed by avoiding a connecting part 121. That is, the inner material layer B may be formed to be separated from the connecting part 121 of the pad 120. In such a case, the inner material layer B may not be continuously formed.

Figure 15:
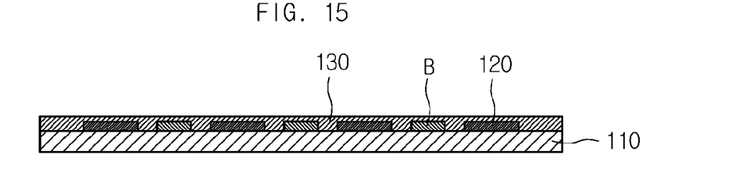

Referring to FIG. 15, in the step of forming the solder resist 130 (S220), the solder resist 130 is formed on the substrate 110 so as to cover the pad 120 and the inner material layer B. The solder resist 130 covers an entire surface of the substrate 110.

Figure 16:
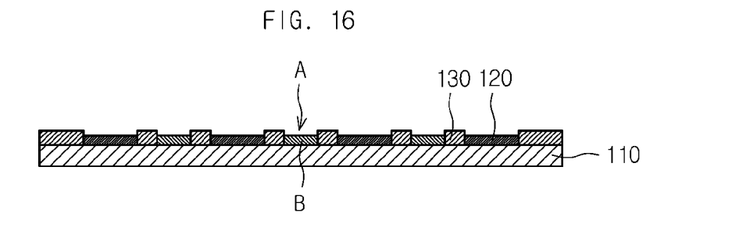

Referring to FIG. 16, in the step of removing the solder resist 130 so as to expose the pad 120 (S230), a portion of the solder resist 130 corresponding to the pad 120 is removed in such a way that the pad 120 is exposed. This has been described above and thus will not be redundantly described herein.

In the step of forming an opening A so as to expose the inner material layer B (S240), a portion of the solder resist 130 is removed in such a way that the inner material layer B is exposed. The step of forming the opening A (S240) may be performed simultaneously with the step of removing the solder resist 130 so as to expose the pad 120 (S230).

Figure 17:
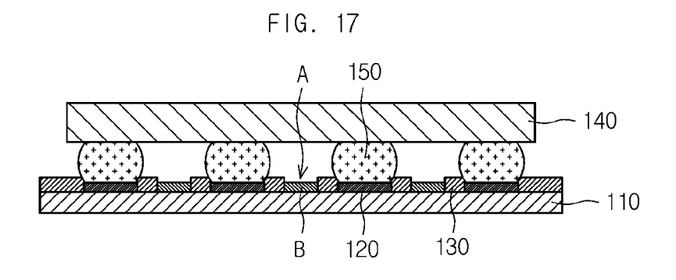

Referring to FIG. 17, in the step of mounting a chip 140 (S250), the chip 140 having the plurality of bumps 150 therein is mounted on the substrate 110. This has been described above and thus will not be redundantly described herein.

Referring to FIG. 17, in the step of filling with the under-fill 160 (S260), the under-fill 160 is flowed in between the plurality of bumps 150, and the under-fill 160 is filled between the substrate 110 and the chip 140. Here, a greater space for allowing the under-fill 160 to flow may be provided by the opening A, and the wettability is improved by the inner material layer B, thereby allowing the under-fill 160 to flow faster and preventing a void from occurring.

Figure 18:
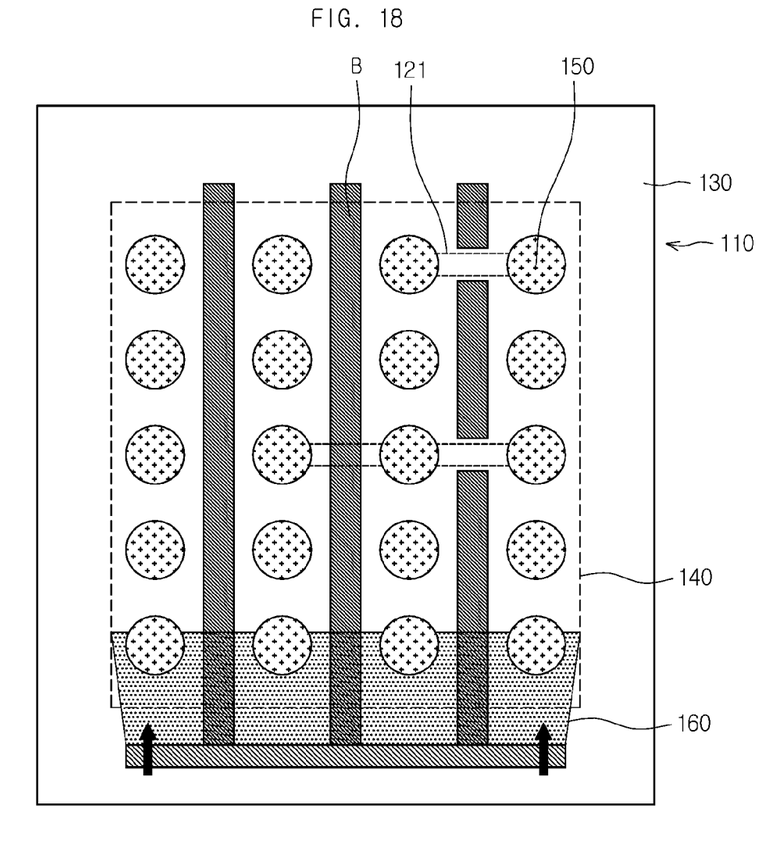

The opening A and the inner material layer B may be extended in the flowing direction of the under-fill 160 and may be formed to be continuous or not continuous in the flowing direction of the under-fill 160.

In the case where the inner material layer B is formed to correspond to a length of the opening A, one end of the inner material layer B may be extended to an area where the under-fill 160 is dispensed. In such a case, the distance between the one end of the inner material layer B to a side of the chip 140 may be 100 um or greater. Moreover, the other end of the inner material layer B may be extended to an outside area of the chip 140.

As described above, the flip chip package and a manufacturing method thereof in accordance with certain embodiments of the present invention may allow an under-fill to flow faster in between bumps and thus prevent a void from occurring.

Although certain embodiments of the present invention have been described, it shall be appreciated that there can be a very large number of permutations and modification of the present invention by those who are ordinarily skilled in the art to which the present invention pertains without departing from the technical ideas and scope of the present invention, which shall be defined by the claims appended below. It shall be also appreciated that many other embodiments than the embodiments described above are included in the claims of the present invention.

What is claimed is:

1. A method of manufacturing a flip chip package, comprising:
   forming a plurality of pads on a substrate;
   forming a solder resist on the substrate so as to cover the pads;
   removing portions of the solder resist so as to expose the pads;
   forming an opening by removing a portion of the solder resist arranged in between the plurality of pads;
   mounting a chip, which has a plurality of bumps thereon, on the substrate in such a way that the bumps are in contact, respectively, with the pads; and
   filling a space between the substrate and the chip with an under-fill by flowing the under-fill in between the plurality of bumps.

2. The method of claim 1, wherein the forming of the plurality of pads on the substrate comprises forming an inner material layer on the substrate in such a way that the inner material layer is arranged in between the plurality of pads,
   wherein the solder resist covers the pads and the inner material layer,
   wherein the inner material layer is exposed by the opening, a wettability of the under-fill for the inner material layer is greater than a wettability of the under-fill for the solder resist.

3. The method of claim 2, wherein the inner material layer is made of a metal.

4. The method of claim 2, wherein the inner material layer is formed to be separated from the pads.

5. The method of claim 2, wherein the forming of the plurality of pads on the substrate further comprises forming a connecting part on the substrate for connecting at least two of the pads with one another, and wherein the inner material layer is formed to be separated from the connecting part.

6. The method of claim 1, wherein the filling of the space between the substrate and the chip with the under-fill comprises:

dispensing the under-fill to one side of the substrate; and allowing the under-fill to flow to the other side of the substrate.

7. The method of claim 6, wherein the opening is extended in a flowing direction of the under-fill.

8. The method of claim 7, wherein one end of the opening is extended to an area of the substrate where the under-fill is dispensed.

9. The method of claim 8, wherein the other end of the opening is extended to an outside area of the chip.

\* \* \* \* \*